United States Patent [19]

Zheng

[11] Patent Number: 5,160,793
[45] Date of Patent: Nov. 3, 1992

[54] SHALLOW OHMIC CONTACTS TO N-AL$_x$GA$_{1-x}$AS

[75] Inventor: Longru Zheng, Webster, N.Y.

[73] Assignee: Eastman Kodak Company, Rochester, N.Y.

[21] Appl. No.: 711,830

[22] Filed: Jun. 7, 1991

[51] Int. Cl.$^5$ .............................................. H01L 29/12
[52] U.S. Cl. ..................................... 428/620; 257/762
[58] Field of Search ............... 428/620, 621, 672, 673, 428/669, 670; 437/184; 357/30 C, 67, 71, 71 P, 71 S, 71 T

[56] References Cited

U.S. PATENT DOCUMENTS

| | | | |
|---|---|---|---|
| 3,716,907 | 2/1973 | Anderson | 357/67 |
| 4,042,951 | 8/1977 | Robinson et al. | 357/71 |
| 4,186,410 | 1/1980 | Cho et al. | 357/67 |
| 4,989,065 | 1/1991 | Tsuchimoto et al. | 357/67 |
| 5,077,599 | 12/1991 | Yano et al. | 357/67 |
| 5,100,835 | 3/1992 | Zheng | 437/184 |

OTHER PUBLICATIONS

"AuNiGe Contacts to GaAs"; IBM Technical Disclosure Bulletin; vol. 28, No. 7; Dec. 1985; pp. 3183–3184.
"Ohmic Contact to Gallium Phosphide"; IBM Technical Disclosure Bulletin; vol. 11, No. 11; Apr. 1969; p. 1475.
Sands, et al.; "Ni, Pd and Pt on GaAs; A comparative study of interfacial structures, compositions and reacted film morphologies".
J. Mater. Res. 2(2), Mar./Apr. 1987; pp. 262–275.
Devlin, et al.; "A Molybdenum Source, Gate and Drain Metalization System For GaAs MESFET Layers Grown by Molecular Beam Epitaxy"; Oct. 1979; pp. 823–829.
Barnes, et al.; "Nonalloyed Ohmic Contacts to n-GaAs by Molecular Beam Epitaxy"; Appl. Phys. Lett., 33(7); Oct. 1978; pp. 651–653.
Salmon, et al.; "The Effect of Aluminum Composition on Silicon Donar Behavior in Al$_x$Ga$_1$-xAs"; J. Vac. Sci. Technol. B2, Apr.–Jun. 1984; pp. 197–200.
Pamish; "Phase Equilibria in the System of Al-Ga-As-Sn and Electrical Properties of Sn-doped Liquid Phase Epitaxial Al$_x$Ga$_{x-1}$As"; J. Appl. Phys., vol. 44, No. 6; Jun. 1973; pp. 2667–2674.
Marshall, et al.; Planar Ge/Pd and Alloyed Al-Ge-Ni Ohmic Contacts to n-Al$_y$Ga$_{x-1}$As ($0 \leq x \leq 0.3$); Appl. Physical Letters 54(8), Feb. 1989; pp. 721–723.
E. D. Marshall, W. X. Chen, C. S. Wu, S. S. Lau and T. F. Kuech, Appl. Phys, Lett. 47, 298 (1985).

Primary Examiner—Michael Lewis
Assistant Examiner—Valerie Lund
Attorney, Agent, or Firm—Raymond L. Owens

[57] ABSTRACT

Formation of shallow ohmic contacts with low contact resistance on n-Al$_x$Ga$_{1-x}$As by sequential deposition of Pd/Au-Ge/Ag/Au and rapid thermal annealing.

3 Claims, 2 Drawing Sheets

5,160,793

SHALLOW OHMIC CONTACTS TO N-Al$_x$Ga$_{1-x}$As

CROSS REFERENCE TO RELATED APPLICATION

Reference is made to commonly assigned U.S. patent application Ser. No. 670,636 filed Mar. 18, 1991, U.S. Pat. No. 5,100,835, and entitled SHALLOW OHMIC CONTACTS TO N-GaAs.

FIELD OF THE INVENTION

The present invention relates to shallow ohmic contacts on n-Al$_x$Ga$_{1-x}$As and a method of making such contacts.

BACKGROUND OF THE INVENTION

Al$_x$Ga$_{1-x}$As is being used in LED (light emitting diode) to form a double heterostructure, which is the most efficient because carrier and optical confinement can be achieved. For efficient and reliable operation of devices, it is essential to have ohmic contacts with low contact resistance. Previous investigations of ohmic contacts to n type Al$_x$Ga$_{1-x}$As have primarily focused on alloyed Au-Ge-Ni contacts through GaAs cap layers. The formation of ohmic contacts directly on n-type Al$_x$Ga$_{1-x}$As has not been successful yet for Al$_x$Ga$_{1-x}$As where x is greater than 0.3 as described in the article of E. D. Marshall et al., entitled "Planar Ge/Pd and alloyed Au-Ge-Ni ohmic contacts to n-Al$_x$Ga$_{1-x}$As ($0 \leq x \leq 0.3$)", published in APPLIED PHYSICS LETTERS, Vol. 54, No. 8, pgs. 721-723, Feb. 20, 1989. The contact resistivity is relatively high in the range of $10^{-4}$ ohm-cm$^2$, and vertical and lateral penetration of the contact is commonly observed on the order of 100 nm. With the recently developed Pd/Ge metallization scheme, the contact resistivity on Al$_{0.3}$Ga$_{0.7}$As was approximately $1 \times 10^{-4}$ ohm-cm$^2$.

FIG. 1 to which it is now made reference illustrates the different contact resistivity on n-Al$_x$Ga$_{1-x}$As with different metallization schemes. The curve defined by the points referenced as o illustrates the contact resistivity obtained with the recently developed Pd/Ge metallization scheme. The curve defined by the points referenced as = illustrates the contact resistivity obtained with the AuGe/Ni/Au metallization scheme. The point referenced as Δ illustrates the contact resistivity obtained with the Ni/AuGe/Ni/Au metallization scheme. From these curves it appears that the contact resistivity increases rapidly with increasing AlAs mole fraction (x). For example, with the Pd/Ge metallization scheme the contact resistivity is found to be $5 \times 10^{-7}$ ohm-cm on GaAs and to increase to $1 \times 10^{-4}$ ohm-cm on Al$_{0.3}$Ga$_{0.7}$As. With the AuGe/Ni/Au metallization scheme the contact resistivity increases from $3 \times 10^{-6}$ ohm-cm$^2$ on GaAs to $7 \times 10^{-4}$ ohm-cm$^2$ on Al$_{.35}$Ga$_{.65}$As. With the Ni/AuGe/Ni/Au metallization scheme the contact resistivity on Al$_{0.4}$Ga$_{0.6}$As is about $2.5 \times 10^{-4}$ ohm-cm$^2$. No data have been reported for x greater than 0.4.

SUMMARY OF THE INVENTION

It is the object of this invention to develop an ohmic contact to n-Al$_x$Ga$_{1-x}$As with a low contact resistivity and a uniform interface, especially for values of x 0.3 and 0.8.

In accordance with this invention, a shallow ohmic contact to a n-type Al$_x$Ga$_{1-x}$As layer comprises: (a) a thin layer of palladium formed on the surface of the Al$_x$Ga$_{1-x}$As layer; (b) a layer of Au-Ge formed on the Pd layer; (c) a layer of Ag formed on the Au-Ge layer; and (d) a layer of Au formed on the Ag layer.

A feature of this invention is that the metallization scheme brings benefits to contacts: (1) it forms contacts to Al$_x$Ga$_{1-x}$As with good adherence; (2) it provides a low contact resistivity for Al$_x$Ga$_{1-x}$As at a high AlAs mole fraction. Ohmic contacts produced in accordance with this invention have a contact resistivity of $5.5 \times 10^{-5}$ ohm-cm$^2$ at x=0.55; and (3) it limits interfacial relation and produces an abrupt and uniform interface.

Other objects of the invention will appear in the more detailed description which follows.

DETAILED DESCRIPTION OF THE PREFERRED EMBODIMENTS

In accordance with this invention ohmic contact to n-type Al$_x$Ga$_{1-x}$As is provided by sequential deposition of Pd/Au-Ge/Ag/Au and rapid thermal annealing.

Figure 2:
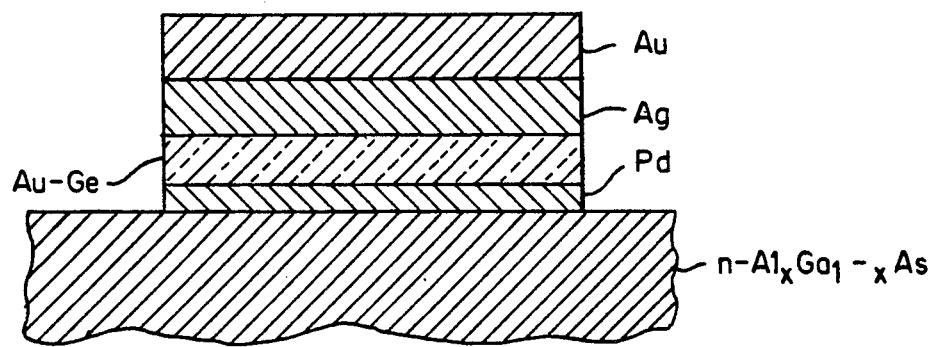
FIG. 2 is a schematic cross-section of a shallow ohmic contact to a n-type Al$_x$Ga$_{1-x}$As substrate made in accordance with the invention.

In FIG. 2, there is shown a n-type Al$_x$Ga$_{1-x}$As substrate where x is being from greater than 0.3 and 0.8, and with a carrier concentration of about $10^{17}$-$10^{18}$/cm$^3$. Whenever the term "n-type Al$_x$Ga$_{1-x}$As substrate" is used, it will be understood that only the top layer of the substrate needs to be n-type Al$_x$Ga$_{1-x}$As. This is because only a thin surface layer of n-Al$_x$Ga$_{1-x}$As of 10-20 nm is needed to provide the contact. In general, the substrate could be a n-Al$_x$Ga$_{1-x}$As/GaAs. This substrate is loaded in an evaporation system at a base pressure of about $1-2 \times 10^{-6}$ Torr. The system includes a conventional resistance heating system which evaporates different materials placed in different crucibles. When a material is evaporated, its crucible is placed in operative relation with a heater system. An example of such a vacuum system is "SC-5000 High Vacuum Evaporator" manufactured by CVC Products Inc. It should be noted that other systems such as an e-beam evaporator and a sputter-deposition system can also be used. Palladium is loaded in a crucible and heated to a point where it evaporates and deposits upon the surface of the gallium arsenide. It has been found preferable that the palladium should have a thickness of between 20-100 Å. After the palladium is appropriately deposited, without breaking the vacuum a crucible containing an alloy of gold germanium is moved into operative relation to the heater. The heater then heats the gold germanium until it evaporates and deposits onto the surface of the palladium. The gold germanium should have a thickness range of from 200-1500 Å. In addition to which, the germanium in this alloy can have a range of 15-50% of atomic percent. After the appropriate thickness of the gold germanium layer has been produced crucible containing silver is then disposed over the heater and it in turn is heated to produce a layer having a thickness of 500-1500 Å. Finally a crucible containing gold is disposed over the heater and a gold is evaporated to form a layer with a thickness from 500 to 3000 Å. The resulting structure is then subjected to rapid thermal annealing at 400°-550° C. for 10-60 seconds.

A substantial amount of Au and Ag is needed to obtain low sheet resistance, while the upper value of their thickness should be limited for this metallization scheme compatible with device processing. A sufficient amount of Ge is needed to produce a Ge-doped GaAs layer for contact formation, but the structure with an Au-Ge layer thicker than 1500 Å would exhibit morphological degradation after processing. The amount of Pd should be enough to cover the entire GaAs surface and form a Pd-GaAs layer with a thickness of 20-30 Å. Thicker Pd layers would not bring any benefit to contact performance. The annealing temperature higher than 550° C. or the annealing time longer than 60 seconds would produce morphological degradation. The temperature lower than 400° C. or the time less than 10 seconds would substantially increase the contact resistance.

EXPERIMENTAL PROCEDURE

For specific contact resistance measurements, samples with transmission line mode were prepared. 200 nm of n-$Al_{0.55}Ga_{0.45}As$ with a carrier concentration of $7.5 \times 10^{17}/cm^3$ was grown on a semi-insulating GaAs substrate by liquid phase epitaxy (LPE). $Al_{0.55}Ga_{0.45}As$ islands were formed on GaAs by wet etching ($H_2SO_4$:$H_2O_2$:$H_2O$ = 1:8:80) with CVD deposited 200 nm of $SiO_2$ as a mask. After photolithography, the sample was carefully cleaned to remove oxides on $Al_{0.55}Ga_{0.45}As$ islands. The cleaning procedure includes the following steps: (1) dip etching in a solution of $NH_4OH$:$H_2O_2$:$H_2O$ = 10:1:200 for 30 seconds, (2) rinse in deionized water, (3) dip etching in a solution of $HF$:$HNO_3$:$H_2O$ = 1:1:50 for 20 seconds and (4) rinse in deionized water. The sample was loaded in an evaporation system at a base pressure of about $10^{-6}$ Torr. Sequential deposition of desired metals using resistive heating and lift off were employed to form metal lines of Pd (5nm)/AuGe (60nm)/Ag (100nm)/Au (100 nm) on $Al_{0.55}Ga_{0.45}As$.

Figure 1:
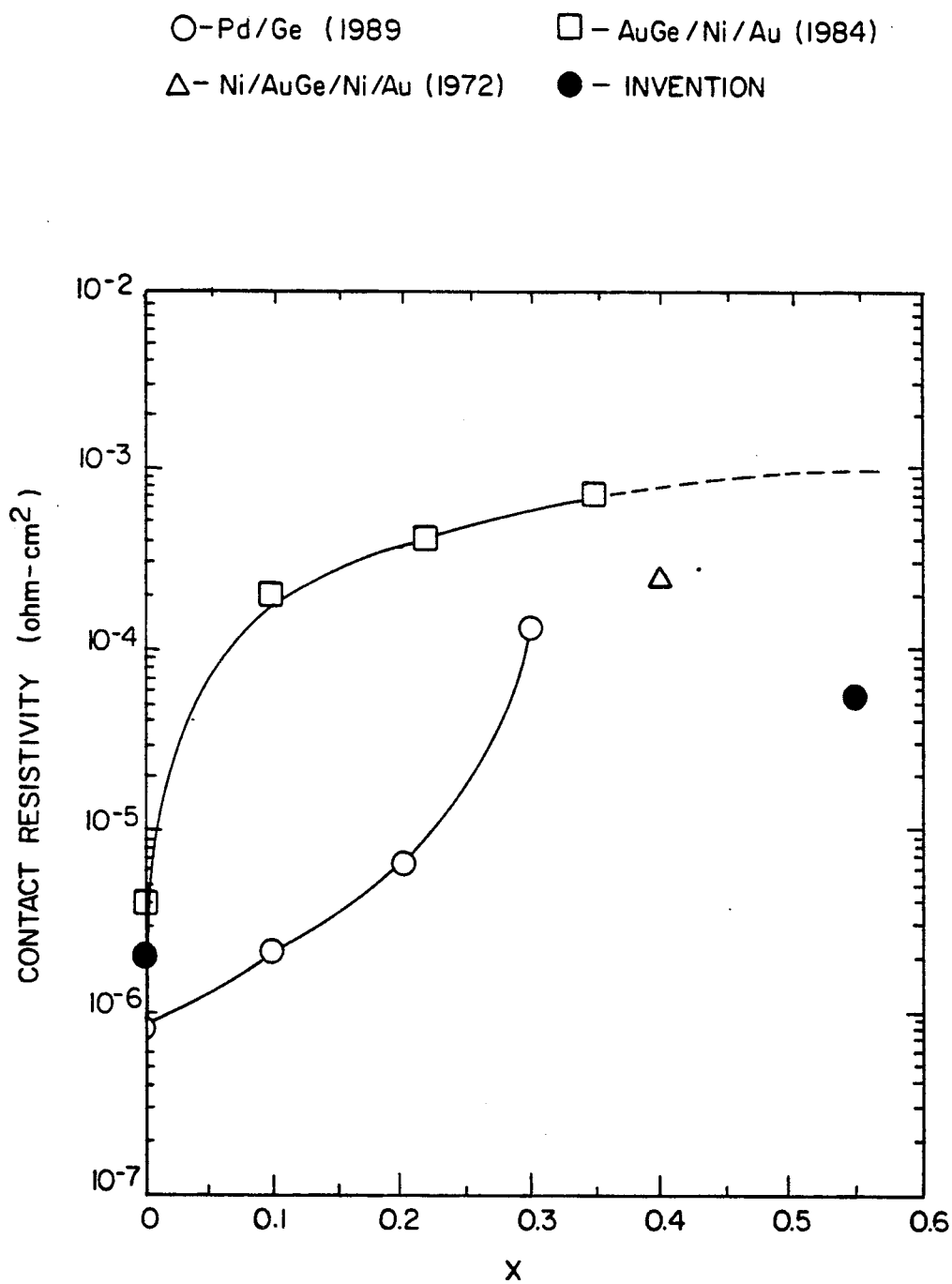
FIG. 1 represents different curves illustrating different values of the contact resistivity on n-Al$_x$Ga$_{1-x}$As substrate with different metallization schemes.

Turning now to FIG. 1, in which two points referenced as are located on the graph to illustrate different contact resistivity values obtained according to the invention for different values of x. It appears that for x=0.55 the contact resistivity is of about $5.5 \times 10^{-5}$ ohm-cm$^2$ which is substantially better than the values obtained with other metallization schemes for a lower x value. The metallization scheme and the procedure of making contacts according to the present invention can be applied with x varying from 0 to about 0.8.

EXAMPLE

The samples were annealed in $N_2$ for 30 seconds at 450°-550° C. The metal lines adhered well to $Al_{0.55}Ga_{0.55}$ $_{45}As$ with no indication of peeling. The surface was quite smooth after annealing up to 500° C. Anneals at 550° C. resulted in a relatively rough surface, however, the interface between metals and $Al_{0.55}Ga_{0.45}As$ remained uniform and abrupt. No metal penetration or substrate erosion was revealed by SEM cross-sectional photographs. Ion backscattering spectra showed the diffusion depth of the metallization is about 20 nm. The contact resistivity was about $4 \times 10^4$ ohm-cm$^2$ after 30 seconds at 450° C. and dropped to $5.5 \times 10^{-5}$ ohm-cm$^2$ after 30 sec at 550° C. Both Ni/AuGe/Ni/Au and Pd/Ge have been used in the literature to form ohmic contacts to $Al_xGa_{1-x}As$.[1-3] FIG. 1 shows the comparison of the data reported in this invention and that in the literature, the references of which are the following:

1. Z. Liliental, R. W. Carpenter and J. Escher, Ultramicroscopy, 14, 135 (1984).
2. K. K. Shih and J. M. Blum, Solid-State Electronics, 15, 1177 (1972).
3. E. D. Marshall, L. S. Yu, S. S. Lau, T. F. Kuech, and K. L. Kavanagh, Appl. Phys. Lett. 54, 721 (1989).

The extrapolated contact resistivities from the data reported in references 1 and 3 are found to be about one order of magnitude higher than that obtained according to this invention. Moreover, the contacts formed by the Ni/AuGe/Ni/Au structure commonly show severe metallurgical reaction between metals and $Al_xGa_{1-x}As$. In contrast, the reaction obtained according to the invention is limited and an abrupt and uniform interface is achieved.

In the conventional Au-Ge metallization, the contact is spatially nonuniform with regions of deep Au penetration into the $Al_xGa_{1-x}As$. The nonuniform contacts are attributed to the reaction involving some liquid phases and the existence of $Al_xGa_{1-x}As$ native oxides.

Using silver to replace nickel significantly limits the contact-substrate reaction. Au-Ag solid solutions are formed upon annealing to impede Au indiffusion and increase the eutectic temperature. When Pd is used as the first layer, it reacts with GaAs to form a ternary phase at room temperature and disperses the interfacial oxides. The subsequent reaction depends on processing temperature. (1) When the temperature is below the Au-Ag-Ge eutectic, the reaction occurs between Ge and the ternary, resulting in decomposition of the ternary phase and expitaxial growth of a Ge-doped $Al_xGa_{1-x}As$ layer. As a result, uniform ohmic contacts with good adherence to n-GaAs are formed. (2) When the temperature is above the Au-Ag-Ge eutectic, the contact may form via liquid phase reaction. However, the interface between contacts and $Al_xGa_{1-x}As$ is uniform due to dispersion of interfacial oxides by Pd and the reaction is limited due to the formation of Au-Ag solid solutions.

The invention has been described in detail with particular reference to certain perferred embodiments thereof, but it will be understood that variations and modifications can be effected within the spirit and scope of the invention.

I claim:

1. A shallow ohmic contact to n-type $Al_xGa_{1-x}As$, where x is greater than 0.3, consisting essentially of:
   (a) the n-type carrier concentration being in a range of $10^{17}$ cm$^{-3}$ to $10^{18}$ cm$^{-3}$;
   (b) a layer which has dispersed interfacial oxides between the $Al_xGa_{1-x}As$ substrate and the Pd layer of Pd formed on the surface of the $Al_xGa_{1-x}As$ layer;
   (c) a layer of gold germanium formed on the Pd layer;
   (d) a layer of silver formed on the gold germanium layer; and
   (e) a layer of gold formed on the silver layer.

2. A shallow ohmic contact according to claim 1, wherein x varies greater than 0.3 to 0.8.

3. A shallow ohmic contact to n-type $Al_xGa_{1-x}As$, consisting essentially of:
   (a) the n-type carrier concentration in a range of $10^{17}$ cm$^{-3}$, to $10^{18}$ cm$^{-3}$;
   (b) a layer of formed $_x$As layer and having a thickness of 20-100 Å with x varying from greater than 0.3 to 0.8 which has dispersed interfacial oxides between the $Al_xGa_{1-x}As$ substrate and the Pd layer;

(c) a layer of gold germanium formed on the Pd layer and having a thickness of 200–1500 Å, wherein the germanium has a range of 15–50 atomic percent;

(d) a layer of silver formed on the gold germanium layer and having a thickness of 500–1500 Å; and (e) a layer of gold formed on the silver layer and having a thickness of 500–3000 Å.

* * * * *

UNITED STATES PATENT AND TRADEMARK OFFICE

CERTIFICATE OF CORRECTION

Patent No.: 5,160,793

Dated: November 3, 1991

Inventor: Longru Zheng

It is certified that error appears in the above-identified patent and that said Letters Patent is hereby corrected as shown below:

Column 4, lines 53-56, "(b) a layer which has dispersed interfacial oxides between the $Al_xGa_{1-x}As$ substrate and the Pd layer of Pd formed on the surface of the $Al_xGa_{1-x}As$ layer;" should read -- (b) a layer of Pd formed on the surface of the $Al_xGa_{1-x}As$ layer which has dispersed interfacial oxides between the $Al_xGa_{1-x}As$ substrate and the Pd layer; --

Column 4, line 67, "(b) a layer of formed on" should read -- (b) a layer of Pd formed on the surface of the $Al_xGa_1$. --.

Signed and Sealed this

Ninth Day of November, 1993

*Attest:*

BRUCE LEHMAN

*Attesting Officer*    Commissioner of Patents and Trademarks